(12) United States Patent
Lee et al.

(10) Patent No.: US 11,961,849 B2
(45) Date of Patent: Apr. 16, 2024

(54) DISPLAY DEVICE HAVING MULTIPLE INSULATING LAYERS OF SAME MATERIAL

(71) Applicant: Samsung Display Co., LTD., Yongin-si (KR)

(72) Inventors: Keum Hee Lee, Cheonan-si (KR); Dong Hoon Shin, Paju-si (KR); June Whan Choi, Seoul (KR); Seung Sok Son, Goyang-si (KR); Woo Geun Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 122 days.

(21) Appl. No.: 17/342,088

(22) Filed: Jun. 8, 2021

(65) Prior Publication Data

US 2022/0102390 A1    Mar. 31, 2022

(30) Foreign Application Priority Data

Sep. 29, 2020    (KR) .......................... 10-2020-0126975

(51) Int. Cl.
*H01L 27/12*    (2006.01)

(52) U.S. Cl.
CPC ........ *H01L 27/1248* (2013.01); *H01L 27/124* (2013.01)

(58) Field of Classification Search
CPC ..................... G02F 1/133345; G02F 1/16756
See application file for complete search history.

(56) References Cited

U.S. PATENT DOCUMENTS

| RE46,922 E | 6/2018 | Jeong et al. |
| 2005/0116292 A1* | 6/2005 | Koo ............... H01L 27/1277 257/350 |
| 2008/0018816 A1* | 1/2008 | Hattori ........... G02F 1/136213 349/39 |
| 2012/0242565 A1* | 9/2012 | Noh .................. G02F 1/1677 345/107 |

FOREIGN PATENT DOCUMENTS

| KR | 10-2016-0150199 | 12/2016 |
| KR | 10-1782557 | 9/2017 |
| KR | 10-2018-0013369 | 2/2018 |
| KR | 10-2018-0014407 | 2/2018 |

\* cited by examiner

*Primary Examiner* — Lauren Nguyen
(74) *Attorney, Agent, or Firm* — KILE PARK REED & HOUTTEMAN PLLC

(57) ABSTRACT

A display device includes a base layer; a first pattern disposed on the base layer; an insulating layer disposed on the first pattern and including layers; and a second pattern disposed on the insulating layer. At least two of the layers of the insulating layer include a same material.

16 Claims, 17 Drawing Sheets

DISPLAY DEVICE HAVING MULTIPLE INSULATING LAYERS OF SAME MATERIAL

CROSS-REFERENCE TO RELATED APPLICATION(S)

This application claims priority to and benefits of Korean Patent Application No. 10-2020-0126975 under 35 U.S.C. § 119, filed on Sep. 29, 2020 in the Korean Intellectual Property Office, the entire contents of which are incorporated herein by reference.

BACKGROUND

1. Technical Field

This disclosure relates to a display device and a manufacturing method thereof.

2. Description of the Related Art

As a device that displays an image, a display device such as an emissive display device is used. The display device may include a display panel including pixels and circuit elements for driving the pixels. The display panel may include insulating layers to insulate the circuit elements. When a defect occurs in the insulating layers, the circuit elements may be damaged or a short circuit may occur.

The above information disclosed in this background section is only for enhancement of understanding of the background, and therefore it may contain information that does not form the prior art that is already known to a person of ordinary skill in the art.

SUMMARY

Embodiments provide a display device capable of preventing a decrease in reliability due to defects in insulating layers.

A display device according to an embodiment may include a base layer; a first pattern disposed on the base layer; an insulating layer disposed on the first pattern and including a plurality of layers; and a second pattern disposed on the insulating layer. At least two of the plurality of layers of the insulating layer may include a same material.

The insulating layer may include a lower layer including one or more layers; and an upper layer disposed on the lower layer and including one or more layers, and a lowermost layer of the lower layer and a lowermost layer of the upper layer may include a same material.

The lower layer may not overlap the first pattern, and the first pattern may include a portion that contacts the lowermost layer of the upper layer.

An uppermost layer of the lower layer and an uppermost layer of the upper layer may include a same material.

Each of the lower layer and the upper layer of the insulating layer may include a plurality of layers.

The plurality of layers of each of the lower layer and the upper layer of the insulating layer may include layers including different materials.

The plurality of layers of each of the lower layer and the upper layer of the insulating layer may include layers having different hydrogen contents or different densities.

The lower layer and the upper layer of the insulating layer may include different numbers of layers.

Each of the lower layer and the upper layer of the insulating layer may be a single layer.

The display device may further include a substrate; a light blocking layer disposed on the substrate; a buffer layer disposed on the light blocking layer; a semiconductor layer of a transistor disposed on the buffer layer; a gate insulating layer disposed on the semiconductor layer of the transistor; a gate electrode of the transistor disposed on the semiconductor layer of the transistor; an interlayer insulating layer disposed on the gate electrode; an electrode of the transistor disposed on the interlayer insulating layer; and a passivation layer disposed on the electrode of the transistor. The insulating layer may be one of the buffer layer, the gate insulating layer, the interlayer insulating layer, and the passivation layer.

The first pattern may be one of the light blocking layer, the semiconductor layer of the transistor, the gate electrode, and the electrode of the transistor.

The display device may further include a connection electrode disposed on the passivation layer. The second pattern may be one of the semiconductor layer of the transistor, the gate electrode, the electrode of the transistor, and the connection electrode.

A display device according to an embodiment may include a substrate; a buffer layer disposed on the substrate; a semiconductor layer of a transistor disposed on the buffer layer; a gate insulating layer disposed on the semiconductor layer of the transistor; a gate electrode of the transistor disposed on the semiconductor layer of the transistor; an interlayer insulating layer disposed on the gate electrode; an electrode of the transistor disposed on the interlayer insulating layer; and a passivation layer disposed on the electrode of the transistor. At least one of the buffer layer, the gate insulating layer, the interlayer insulating layer, and the passivation layer may include a plurality of layers, and at least two of the plurality of layers may include a same material.

The plurality of layers may include a first layer, a second layer, a third layer, and a fourth layer stacked sequentially, and the first layer and the third layer may include a same material.

The second layer and the fourth layer may include a same material.

The first layer and the second layer may include different materials or may include a different composition ratio, hydrogen content, and density.

The plurality of layers may include a first layer, a second layer, a third layer, and a fourth layer stacked sequentially, and the first layer and the fourth layer may include a same material.

The plurality of layers may further include a fifth layer stacked on the fourth layer, and the third layer and the fifth layer may include a same material.

The plurality of layers may further include a fifth layer and a sixth layer stacked sequentially on the fourth layer, and the third layer and the fifth layer may include a same material.

The plurality of layers may include only two layers.

According to the embodiments, it is possible to provide a display device capable of preventing a decrease in reliability due to defects in insulating layers. According to embodiments, there are other advantageous effects that can be recognized throughout the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
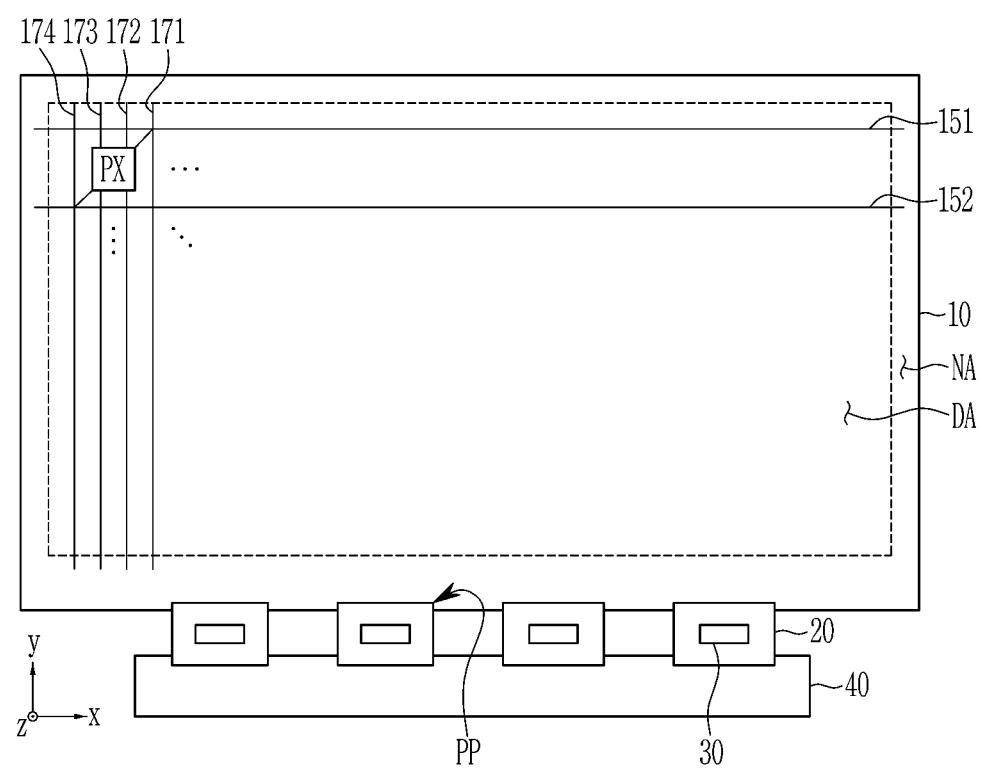
FIG. 1 illustrates a schematic top plan view of a display device according to an embodiment.

The disclosure will be described more fully hereinafter with reference to the accompanying drawings, in which embodiments are shown.

This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Further, sizes and thicknesses of constituent elements shown in the accompanying drawings may be exaggerated for better understanding and ease of description. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In addition, unless explicitly described to the contrary, the word "comprise" and variations such as "comprises" or "comprising", "includes," and/or "including,", "has," "have," and/or "having," and variations thereof will be understood to imply the inclusion of stated elements but not the exclusion of any other elements.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

The phrase "in a plan view" means viewing the object from the top, and the phrase "in a schematic cross-sectional view" means viewing a cross-section of which the object is vertically cut from the side.

In the drawings, signs "x", "y", and "z" are used to indicate directions, wherein x is used for indicating a first direction, y is used for indicating a second direction that is perpendicular to the first direction, and z is used for indicating a third direction that is perpendicular to the first direction and the second direction. The first direction x, the second direction y, and the third direction z may correspond to a horizontal direction, a vertical direction, and a thickness direction of the display device, respectively.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a schematic top plan view of a display device according to an embodiment.

Referring to FIG. 1, the display device may include a display panel 10, a flexible circuit board 20, an integrated circuit chip 30, and a printed circuit board 40.

The display panel 10 may include a display area DA corresponding to a screen on which an image or images is/are displayed and a non-display area NA, and circuits and/or signal lines for generating and/or transferring various signals and voltages applied to the display area DA may be disposed in the non-display area NA. The non-display area NA may be positioned or disposed to surround or to be adjacent to a periphery of the display area DA. In FIG. 1, a dotted-line rectangle represents the boundary between the display area DA and the non-display area NA.

Pixels PX are disposed in a matrix form in the display area DA of the display panel 10. Signal lines such as a first scan line 151, a second scan line 152, a data line 171, a driving voltage line 172, a common voltage line 173, and an initializing voltage line 174 may also be arranged or disposed in the display area DA. The first scan line 151 and the second scan line 152 may extend substantially in a first direction x. The data line 171, the driving voltage line 172, the common voltage line 173, and the initialization voltage line 174 may extend substantially in a second direction y. At least one of the driving voltage line 172, the common voltage line 173, and the initialization voltage line 174 may include a voltage line extending substantially in the first direction x and a voltage line extending substantially in the second direction y, and may be arranged or disposed in the form of a mesh. Each of the pixels PX may be electrically connected to a first scan line 151, a second scan line 152, a data line 171, a driving voltage line 172, a common voltage line 173, an initialization voltage line 174, or the like, to receive a first scan signal, a second scan signal, a data voltage, a driving voltage, a common voltage, and the like from these signal lines. The pixel PX may be implemented as a light emitting element such as a light emitting diode.

Touch electrodes for detecting a user's contact touch and/or a non-contact touch may be disposed in the display area DA of the display panel 10.

A pad portion PP in which pads for receiving signals from the outside of the display panel 10 may be disposed in the non-display area NA of the display panel 10, and a first end portion of the flexible circuit board 20 may be bonded to the pad portion PP. Pads of the flexible circuit board 20 may be electrically connected to the pads of the pad portion PP. The display panel 10 may include two or more pad portions PP, and the pad portions PP may be positioned or disposed spaced apart from each other along an edge of the display panel 10. A corresponding flexible circuit board 20 may be bonded to each of the pad portions PP. The display panel 10 may include one pad portion PP depending on a size thereof, and one flexible circuit board 20 may be bonded thereto.

A driver may be disposed in the non-display area NA of the display panel 10 to generate and/or process various signals for driving the display panel 10. The driver may include: a data driver to apply a data signal to the data line 171, a gate driver to apply a gate signal to the first scan line 151 and the second scan line 152, and a signal controller to control the data driver and the gate driver. The pixels PX may receive a data voltage or an initialization voltage at a predetermined timing depending on a scan signal generated by the gate driver. The gate driver may be integrated in the display panel 10, and may be disposed on at least one or a side of the display area DA.

The data driver may be provided as the integrated circuit chip 30. The integrated circuit chip 30 may be mounted or disposed in the flexible circuit board 20. Signals outputted from the integrated circuit chip 30 may be transferred to the display panel 10 through the pad portion of the flexible circuit board 20 and the pad portion PP of the display panel 10.

The display device may include a plurality of integrated circuit chips 30, and one integrated circuit chip 30 may be positioned or disposed on each flexible circuit board 20. The integrated circuit chip 30 may be mounted or disposed on the non-display area NA of the display panel 10. The integrated circuit chip 30 may be positioned or disposed between the display area DA and the pad portion PP.

The signal controller may be provided as an integrated circuit chip, and may be mounted or disposed in the printed circuit board 40. The data driver and the signal controller may be provided as an integrated chip.

A second end portion (an opposite end of the first end portion) of the flexible circuit board 20 may be bonded and electrically connected to the pad portion of the printed circuit board 40 to transfer signals between the display panel 10 and the printed circuit board 40. The printed circuit board 40 may include a number of pad portions corresponding to a number of flexible circuit boards 20.

The integrated circuit chip 30 may output signals supplied to the display area DA. For example, the integrated circuit chip 30 may output a data voltage, a driving voltage, a common voltage, an initialization voltage, and the like within the spirit and the scope of the disclosure. A data voltage transfer line, a driving voltage transfer line, a common voltage transfer line, and an initialization voltage transfer line for respectively transferring a data voltage, a driving voltage, a common voltage, and an initialization voltage outputted from the integrated circuit chip 30 to the data line 171, the driving voltage line 172, the common voltage line 173, and the initialization voltage line 174 of the display area DA may be positioned or disposed in the non-display area NA. The integrated circuit chip 30 may also output signals for controlling the gate driver.

Signals outputted from the integrated circuit chip 30 may be inputted into the display panel 10 through pads of the pad portion PP electrically connected to pads positioned or disposed at the first end portion of the flexible circuit board 20. The integrated circuit chip 30 may receive signals that serve as the basis for generating the above signals (for example, image data, related signals, power, or the like,) through the pads positioned or disposed at the second end portion of the flexible circuit board 20 electrically connected to the pads of the pad portion of the printed circuit board 40. A processor, a memory, or the like may be positioned or disposed in the printed circuit board 40. In a case that the display device is applied to a mobile communication terminal, the processor may be an application processor including a central processor, a graphics processor, a modem, and the like within the spirit and the scope of the disclosure. The flexible circuit board 20 may be bent, and the printed circuit board 40 may be disposed on a rear surface of the display panel 10.

Figure 2:
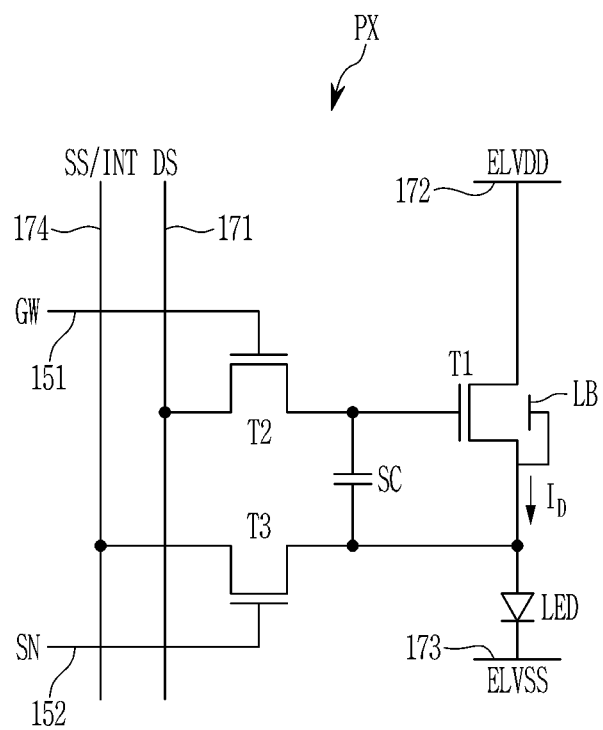
FIG. 2 illustrates an equivalent circuit diagram of one pixel in a display device according to an embodiment.
Figure 3:
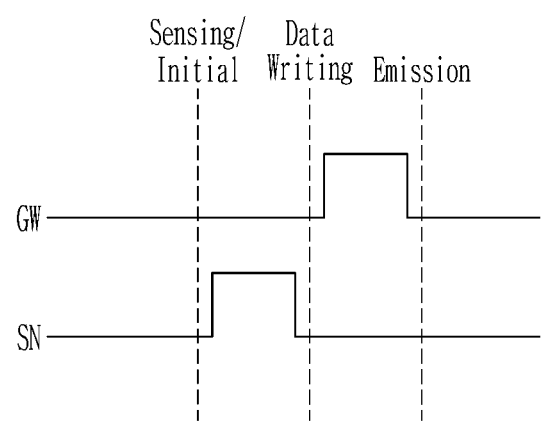
FIG. 3 illustrates a timing diagram of signals applied to one pixel in a display device according to an embodiment.

FIG. 2 illustrates an equivalent circuit diagram of one pixel in a display device according to an embodiment, and FIG. 3 illustrates a timing diagram of signals applied to one pixel in a display device according to an embodiment.

Referring to FIG. 2, the pixel PX may include a first transistor T1, a second transistor T2, a third transistor T3, a storage capacitor SC, and a light emitting diode LED. Signal lines such as a first scan line 151, a second scan line 152, a data line 171, a driving voltage line 172, a common voltage line 173, and an initialization voltage line 174 may be electrically connected to the pixel PX. Although a structure in which the pixel PX may include three transistors and one capacitor is illustrated, a number of transistors and capacitors may be variously changed. Although a structure in which six signal lines are electrically connected to the pixel PX is illustrated, a type and a number of signal lines may be variously modified.

The first transistor T1 may be a driving transistor, the second transistor T2 may be a switching transistor, and the third transistor T3 may be an initialization transistor or sensing transistor. The first transistor T1, the second transistor T2, and the third transistor T3 may be 3-terminal elements each of which may include a first electrode, a second electrode, and a gate electrode.

The first electrode of the first transistor T1 may be electrically connected to the driving voltage line 172 transmitting a driving voltage ELVDD, and the second electrode of the first transistor T1 may be electrically connected to the first electrode (hereinafter, also referred to as a pixel electrode) of the light emitting diode LED. The gate electrode of the first transistor T1 may be electrically connected to the second electrode of the second transistor T2 and a first electrode of the storage capacitor SC. The first transistor T1 may output the driving current ID that varies depending on a magnitude of a data voltage DS applied to the gate electrode through the second transistor T2. The driving current ID may be supplied to the light emitting diode LED, and the light emitting diode LED may emit light with luminance that varies depending on a magnitude of the driving current ID.

The first transistor T1 may include a light blocking layer LB overlapping the semiconductor layer, and the light blocking layer LB may be electrically connected to the second electrode of the first transistor T1, thereby improving characteristics of the first transistor T1 such as an output saturation characteristic.

The first electrode of the second transistor T2 may be electrically connected to the data line 171, and the second electrode of the second transistor T2 may be electrically connected to a gate electrode of the first transistor T1 and the first electrode of the storage capacitor SC. A gate electrode of the second transistor T2 may be electrically connected to the first scan line 151. The second transistor T2 may be turned on depending on a scan signal GW received through the first scan line 151 to perform a switching operation of transferring the data voltage DS applied through the data line 171 to the gate electrode of the first transistor T1 and the first electrode of the storage capacitor SC.

The first electrode of the third transistor T3 may be electrically connected to the initialization voltage line 174, and the second electrode of the third transistor T3 may be electrically connected to the second electrode of the first transistor T1, the second electrode of the storage capacitor SC, and the first electrode of the light emitting diode LED. A gate electrode of the third transistor T3 may be electrically connected to the second scan line 152. The third transistor T3 may initialize the second electrode of the first transistor T1, the second electrode of the storage capacitor SC, and the first electrode of the light emitting diode LED to an initialization voltage SS/INT.

The third transistor T3 and the initialization voltage line 174 may be used to sense a characteristic such as a threshold voltage of the first transistor T1 that causes image quality deterioration. The third transistor T3 may be turned on depending on a sensing signal SN received through the second scan line 152 to electrically connect the first transistor T1 and the initialization voltage line 174, and a sensor electrically connected to the initialization voltage line 174 may sense characteristic information of the first transistor T1 during a sensing period. Variations in characteristics (for example, threshold voltage) of the first transistor T1, which may differ for each pixel PX, may be externally compensated by generating a compensated data voltage by reflecting characteristic information sensed through the third transistor T3 during the sensing period.

The first electrode of the storage capacitor SC may be electrically connected to the gate electrode of the first transistor T1 and the second electrode of the second transistor T2, and the second electrode of the storage capacitor SC may be electrically connected to the second electrode of the first transistor T1 and the first electrode of the light emitting diode LED. The storage capacitor SC may store the data voltage DS, and the stored data voltage DS may be applied to the first transistor T1 during an emission period. The second electrode (hereinafter, also referred to as a common electrode) of the light emitting diode LED may be electrically connected to a common voltage line 173 transmitting a common voltage ELVSS.

An operation of one pixel PX will be described with reference to FIG. 2 and FIG. 3.

During the sensing and initialization period, the sensing signal SN of a high level may be supplied to the pixel PX through the second scan line 152. Accordingly, the third transistor T3 may be turned on to sense the voltage of the first electrode of the light emitting diode LED through the initialization voltage line 174, and may initialize a voltage of the first electrode of the light emitting diode LED by changing it to the initialization voltage INT.

During a data writing period, the scan signal GW of a high level may be supplied to the pixel PX through the first scan line 151. Accordingly, the second transistor T2 may be turned on so as to apply the data voltage DS to the gate electrode of the first transistor T1 and the first electrode of the storage capacitor SC.

During the emission period, the first transistor T1 may output the driving current ID that varies depending on a magnitude of the data voltage DS. The driving current ID may be supplied to the light emitting diode LED, and the light emitting diode LED may emit light with luminance that varies depending on a magnitude of the driving current ID.

A configuration or structure of the display panel 10 that may be included by the display device according to an embodiment will now be described.

Figure 4:
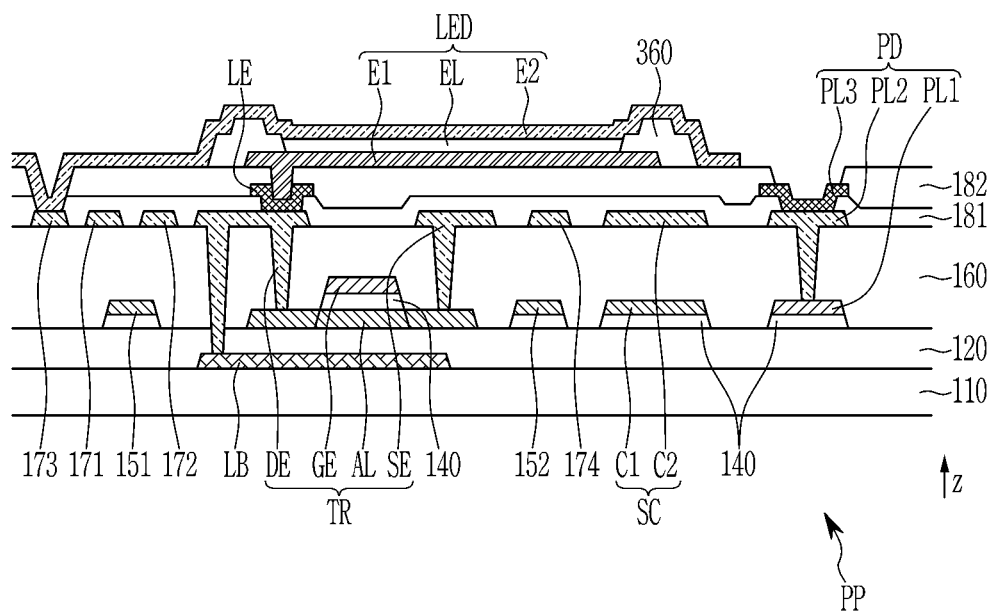
FIG. 4 illustrates a schematic cross-sectional view showing a stacked structure of a display panel according to an embodiment.

FIG. 4 illustrates a schematic cross-sectional view showing a stacked structure of the display panel 10 according to an embodiment. A cross-section illustrated in FIG. 4 may substantially correspond to one pixel area and one pad area.

The display panel 10 may include a substrate 110, a transistor TR positioned or disposed on the substrate 110, and a light emitting diode LED electrically connected to the transistor TR. The light emitting diode LED may correspond to the pixel PX.

The substrate 110 may be a rigid substrate made of glass, quartz, ceramic, or the like, or a flexible substrate made of a polymer such as a polyimide.

A light blocking layer LB may be disposed on the substrate 110. The light blocking layer LB may prevent external light from reaching the semiconductor layer AL of the transistor TR, thereby preventing characteristic deterioration of the semiconductor layer AL. The light blocking layer LB may control a leakage current of the transistor TR, for example, the driving transistor in which a current characteristic is important in an emissive display device. The light blocking layer LB may include a material that does not transmit light in a wavelength band to be blocked, and may be a conductive layer including a metal such as molybdenum (Mo), titanium (Ti), copper (Cu), or aluminum (Al). Accordingly, the light blocking layer LB may function as an electrode to which a specific or selected voltage may be applied in the display panel. A current change rate in the saturation region of a voltage-current characteristic graph of the transistor TR may be reduced to improve characteristics as a driving transistor.

A buffer layer 120 may be disposed on the light blocking layer LB. The buffer layer 120 may improve the characteristics of the semiconductor layer AL by blocking impurities from the substrate 110 in a case that the semiconductor layer AL is formed, and may flatten a surface of the substrate 110 to relieve a stress of the semiconductor layer AL. The buffer layer 120 may be an insulating layer including an inorganic insulating material such as a silicon nitride (SiNx), a silicon oxide (SiOx), and a silicon oxynitride (SiOxNy), and may be a single layer or multiple layers. The buffer layer 120 may include amorphous silicon (Si).

The semiconductor layer AL of a transistor TR may be disposed on the buffer layer 120. The semiconductor layer AL may include a first region and a second region, and a channel region therebetween. The semiconductor layer AL may include any one of an oxide semiconductor, polysilicon, and amorphous silicon. For example, the semiconductor layer AL may include low temperature polysilicon (LTPS), and may include an oxide semiconductor material including at least one of zinc (Zn), indium (In), gallium (Ga), and tin (Sn). For example, the semiconductor layer AL may include an indium-gallium-zinc oxide (IGZO).

A gate insulating layer 140 may be disposed on the semiconductor layer AL. The gate insulating layer 140 may include an inorganic insulating material such as a silicon nitride, a silicon oxide, and a silicon oxynitride, and may be a single layer or multiple layers.

A gate conductive layer that may include the gate electrode GE of the transistor TR, the first electrode C1 of the storage capacitor SC, the first layer PL1 of the pad PD, the first scan line 151, the second scan line 152, or the like, may be disposed on the gate insulating layer 140. A first layer PL1 of a pad PD may be electrically connected to a wire positioned or disposed in the non-display area NA of the display panel 10, and a portion of the wire may constitute the first layer PL1. The gate conductive layer may include molybdenum (Mo), aluminum (Al), copper (Cu), titanium (Ti), and the like, and may be a single layer or multiple layers.

In the illustrated embodiment, the gate insulating layer 140 may be formed only in a region overlapping the gate conductive layer, but the gate insulating layer 140 may also be formed in a region non-overlapping the gate conductive layer.

An interlayer insulating layer 160 may be disposed on the gate conductive layer. The interlayer insulating layer 160 may include an inorganic insulating material such as a silicon nitride, a silicon oxide, and a silicon oxynitride, and may be a single layer or multiple layers.

A data conductive layer that may include a first electrode SE and a second electrode DE of the transistor TR, a second electrode C2 of the storage capacitor SC, a second layer PL2 of the pad PD, a data line 171, a driving voltage line 172, a common voltage line 173, an initialization voltage line 174, or the like, may be disposed on the interlayer insulating layer 160. The first electrode SE and the second electrode DE may be electrically connected to the first region and the second region of the semiconductor layer AL through contact holes formed in the interlayer insulating layer 160, respectively. One of the first electrode SE and the second electrode DE may serve as a source electrode, and the other may serve as a drain electrode. One of the first electrode SE and the second electrode DE may be electrically connected to the light blocking layer LB through a contact hole formed in the interlayer insulating layer 160 and the buffer layer 120. The second layer PL2 of the pad PD may be electrically connected to the first layer PL1 of the pad PD through a contact hole formed in the interlayer insulating layer 160. The data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), and the like, and may be a single layer or multiple layers.

A passivation layer 181 may be disposed on the data conductive layer. The passivation layer 181 may include an inorganic insulating material such as a silicon nitride, a silicon oxide, and a silicon oxynitride, and may be a single layer or multiple layers.

A pad conductive layer that may include a third layer PL3 of the pad PD, a connection electrode LE, and the like may be disposed on the passivation layer 181. The connection electrode LE may be electrically connected to the second electrode DE of the transistor TR through a contact hole formed in the passivation layer 181. The third layer PL3 of the pad PD may be electrically connected to the second layer PL2 of the pad PD through a contact hole formed in the passivation layer 181. Accordingly, the signal inputted to the third layer PL3 may be transferred to the wire through the second layer PL2 and the first layer PL1. The pad conductive layer may include a transparent conductive material such as an indium tin oxide (ITO) or an indium zinc oxide (IZO).

The pad conductive layer may be formed by using a conductor having excellent oxidation resistance or corrosion resistance.

A planarization layer 182 may be disposed on the pad conductive layer. The planarization layer 182 may be an organic insulating layer. For example, the planarization layer 182 may contain polymethylmethacrylate, a general purpose polymer such as polystyrene, a polymer derivative having a phenolic group, an acrylic polymer, an imide-based polymer (for example, polyimide), and an organic insulating material such as a siloxane-based polymer.

A first electrode E1 of the light emitting diode LED may be disposed on the planarization layer 182. The first electrode E1 may be referred to as a pixel electrode. The first electrode E1 may be electrically connected to the connection electrode LE through a contact hole formed in the planarization layer 182. Accordingly, the first electrode E1 may be electrically connected to the second electrode DE of the transistor TR to receive a data voltage for controlling a luminance of the light emitting diode LED. The first electrode E1 may be electrically connected to the second electrode DE through a contact hole formed in the planarization layer 182 and the passivation layer 181. The transistor TR to which the first electrode E1 may be electrically connected may be a driving transistor or a transistor that may be electrically connected to the driving transistor. The first electrode E1 may be formed of a reflective conductive material or a translucent conductive material, or may be formed of a transparent conductive material. The first electrode E1 may include a transparent conductive material such as an indium tin oxide (ITO) or an indium zinc oxide (IZO). The first electrode E1 may include a metal such as lithium (Li), calcium (Ca), aluminum (Al), silver (Ag), magnesium (Mg), or gold (Au), or a metal alloy.

A pixel definition layer 360 may be disposed on the planarization layer 182. The pixel definition layer 360 may be referred to as a partition wall, and may have an opening overlapping the first electrode E1. The pixel definition layer 360 may contain a general purpose polymer such as a polymer derivative having a phenolic group, an acrylic polymer, an imide-based polymer (for example, a polyimide), and an organic insulating material such as a siloxane-based polymer.

The emission layer EL may be disposed on the first electrode E1 of the light emitting diode LED. In addition to the emission layer EL, at least one of a hole injection layer, a hole transport layer, an electron transport layer, and an electron injection layer may be disposed on the first electrode E1.

A second electrode E2 of the light emitting diode LED may be disposed on the emission layer EL. The second electrode E2 may be referred to as a common electrode. The second electrode E2 may be electrically connected to the common voltage line 173 through a contact hole formed in the planarization layer 182. The second electrode E2 may be made of a low work function metal such as calcium (Ca), barium (Ba), magnesium (Mg), aluminum (Al), silver (Ag), or a metal alloy, as a thin layer to have light transmittance. The second electrode E2 may include a transparent conductive oxide such as an indium tin oxide (ITO) or an indium zinc oxide (IZO).

The first electrode E1, the emission layer EL, and the second electrode E2 may constitute a light emitting diode LED, such as an organic light emitting diode. The first electrode E1 may be an anode of a light emitting diode LED, and the second electrode E2 may be a cathode of a light emitting diode LED.

An encapsulation layer (not illustrated) may be disposed on the second electrode E2. The encapsulation layer may encapsulate a light emitting diode LED to prevent moisture or oxygen from penetrating from the outside. The encapsulation layer may be a thin film encapsulation layer including one or more inorganic layers and one or more organic layers. A touch sensor layer (not illustrated) including touch electrodes for sensing a touch may be disposed on the encapsulation layer. An anti-reflection layer (not illustrated) for reducing external light reflection may be disposed on the touch sensor layer.

Figure 5:
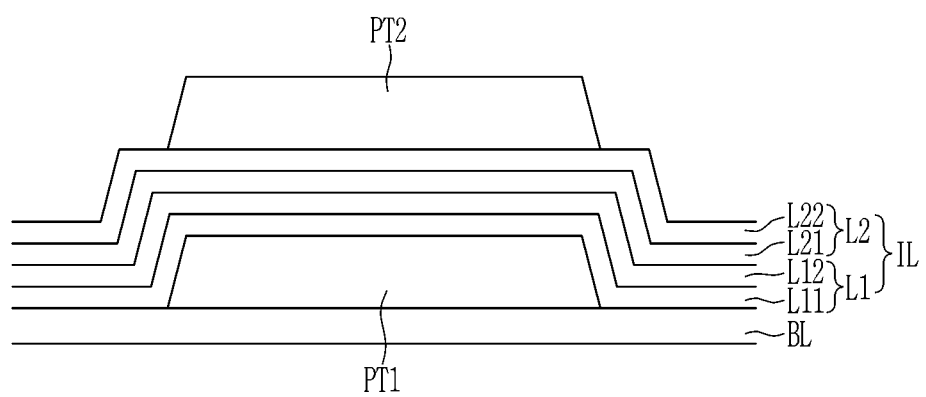
FIG. 5 illustrates a schematic cross-sectional view showing two patterns and an insulating layer disposed therebetween in a display panel according to an embodiment.

FIG. 5 illustrates a schematic cross-sectional view showing two patterns and an insulating layer disposed therebetween in a display panel 10 according to an embodiment.

Referring to FIG. 5, a base layer BL, a first pattern PT1 positioned or disposed on the base layer BL, an insulating layer IL disposed on the first pattern PT1, and a second pattern PT2 positioned or disposed on the insulating layer IL are illustrated.

Referring to FIG. 5, the base layer BL, the first pattern PT1, the insulating layer IL, and the second pattern PT2 may represent four consecutive layers among the layers illustrated in FIG. 4. The base layer BL may be one of the substrate 110, the buffer layer 120, the gate insulating layer 140, and the interlayer insulating layer 160. The insulating layer IL may be one of the buffer layer 120, the gate insulating layer 140, the interlayer insulating layer 160, and the passivation layer 181. The first pattern PT1 may be one of the light blocking layer LB, the semiconductor layer AL, the gate conductive layer, and the data conductive layer. The second pattern PT2 may be one of the semiconductor layer AL, the gate conductive layer, the data conductive layer, and the pad conductive layer. However, the disclosure is not limited thereto.

For example, the base layer BL may serve as the substrate 110, the first pattern PT1 may serve as the light blocking layer LB, the insulating layer IL may serve as the buffer layer 120, and the second pattern PT2 may serve as the semiconductor layer AL. The base layer BL may serve as the buffer layer 120, the first pattern PT1 may serve as the semiconductor layer AL, the insulating layer IL may serve as the gate insulating layer 140, and the second pattern PT2 may serve as the gate electrode GE. The base layer BL may serve as the gate insulating layer 140, the first pattern PT1 may serve as the gate electrode GE, the insulating layer IL may serve as the interlayer insulating layer 160, and the second pattern PT2 may serve as the first electrode SE or the second electrode DE. The base layer BL may serve as the interlayer insulating layer 160, the first pattern PT1 may serve as the first electrode SE or the second electrode DE, the insulating layer IL may serve as the passivation layer 181, and the second pattern PT2 may serve as the connection electrode LE.

The insulating layer IL may include a lower layer L1 and an upper layer L2. The lower layer L1 may include at least one or a layer formed through a first deposition process, and the upper layer L2 may include at least one or a layer formed through a second deposition process. The first deposition process and the second deposition process may be performed under a same condition. Herein, the same condition may indicate that a raw material gas (or a process gas) and that process conditions are the same. Therefore, the upper layer L2 may be a layer formed from a same raw material gas as that of the lower layer L1 under a same process condition.

The lower layer L1 may include a first layer L11 and a second layer L12 which may be sequentially stacked. The upper layer L2 may include a first layer L21 and a second layer L22 which may be sequentially stacked. Accordingly, the first layer L11 of the lower layer L1 and the first layer L21 of the upper layer L2 may be layers formed under a same process condition, and may be formed by using a same material or similar material and made of the same material or similar material. Accordingly, the second layer L12 of the lower layer L1 and the second layer L22 of the upper layer L2 may be layers formed under a same process condition, and may be formed by using a same material or similar material. For example, the first layer L11 of the lower layer L1 and the first layer L21 of the upper layer L2 may include any one of a silicon nitride, a silicon oxide, and a silicon oxynitride, and the second layer L12 of the lower layer L1 and the second layer L22 of the upper layer L2 may include another one of the silicon nitride, the silicon oxide, and the silicon oxynitride. The first layer L11 of the lower layer L1 and the second layer L12 of the lower layer L1 may be layers having different film quality, formed by different film formation conditions (raw material gas and/or process conditions).

Even in a case that the first layer L11 of the lower layer L1, the second layer L12 of the lower layer L1, the first layer L21 of the upper layer L2, and the second layer L22 of the upper layer L2 all contain a same material or similar material (for example, a silicon oxide), the second layer L12 of the lower layer L1 and the second layer L22 of the upper layer L2 may have different film qualities, such as a composition ratio (for example, silicon versus oxygen when containing the silicon oxide), a hydrogen content, and density, from the first layer L11 of the lower layer L1 and the first layer L21 of the upper layer L2. For example, the first layer L11 of the lower layer L1 and the first layer L21 of the upper layer L2 may have a lower hydrogen content than the second layer L12 of the lower layer L1 and the second layer L22 of the upper layer L2. The first layer L11 of the lower layer L1 and the first layer L21 of the upper layer L2 may be denser than the second layer L12 of the lower layer L1 and the second layer L22 of the upper layer L2.

Since the insulating layer IL may include the lower layer L1 and the upper layer L2 formed through separate deposition processes, defects that may occur in a case that the insulating layer is formed in a single deposition process and a resulting decrease in reliability may be prevented. For example, in a case that an insulating layer is formed in one deposition process, there may be a portion where the insulating layer may not be formed due to foreign substances before and after deposition of the insulating layer, a portion of the insulating layer may be torn off, or a defect in which the insulating layer may be peeled off may occur. In a case that conductors disposed below and above the insulating layer are in or near a defective portion of the insulating layer, a short circuit may occur between the conductors. Moisture, oxygen, or the like may penetrate into the defective portion of the insulating layer, and corrosion may occur in the conductive layer.

As in the embodiment, in a case that the lower layer L1 may be formed by a first deposition process, and the upper layer L2 may be formed on the lower layer L1 by a second deposition process in forming the insulating layer IL, even if a defect occurs in the lower layer L1, the upper layer L2 may cover or overlap the defective portion. An interface characteristic between the insulating layer IL and the first pattern PT1 may be maintained under a same condition as that of the lower layer L1.

Each of the lower layer L1 and the upper layer L2 of the insulating layer IL may be an insulating layer that is collectively deposited. Such insulating layer may have a relatively thin thickness. In other words, for example, each of the lower layer L1 and the upper layer L2 may be formed by twice depositing an insulating layer having a relatively thin thickness. Accordingly, in a case that the insulating layer includes two layers, the insulating layer IL may include four layers, and in a case that the insulating layer includes four layers, the insulating layer IL may include six layers. Each of the lower layer L1 and the upper layer L2 may be formed to have a relatively thinner thickness (for example, a thickness in a range of about 30% to about 70%).

FIG. 6, FIG. 7, FIG. 8, and FIG. 9 respectively illustrate schematic cross-sectional views showing a method of forming the insulating layer IL illustrated in FIG. 5.

Figure 6:
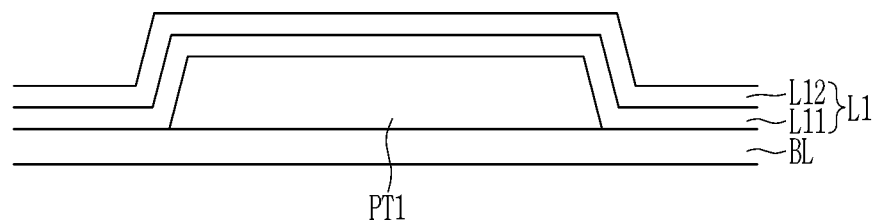
FIG. 6, FIG. 7, FIG. 8, and FIG. 9 respectively illustrate schematic cross-sectional views showing a method of forming the insulating layer illustrated in FIG. 5.

Referring to FIG. 6, the first layer L11 and the second layer L12 of the lower layer L1 may be formed on the base layer BL on which the first pattern PT1 may be formed by the first deposition process. As the deposition process, a chemical vapor deposition (CVD) method such as plasma enhanced chemical vapor deposition (PECVD) may be used. The first layer L11 and the second layer L12 constituting the lower layer L1 of the insulating layer IL may be formed by continuous deposition in one process chamber by using different film formation conditions. Each of the first layer L11 and the second layer L12 may include any one of inorganic insulating materials such as a silicon nitride (SiNx), a silicon oxide (SiOx), and a silicon oxynitride (SiOxNy). The first layer L11 and the second layer L12 may include different materials. The first layer L11 of the lower layer L1 and the second layer L12 of the upper layer L2 may contain a same material or similar material, but may have different film qualities such as a composition ratio, a hydrogen content, and density.

Figure 7:
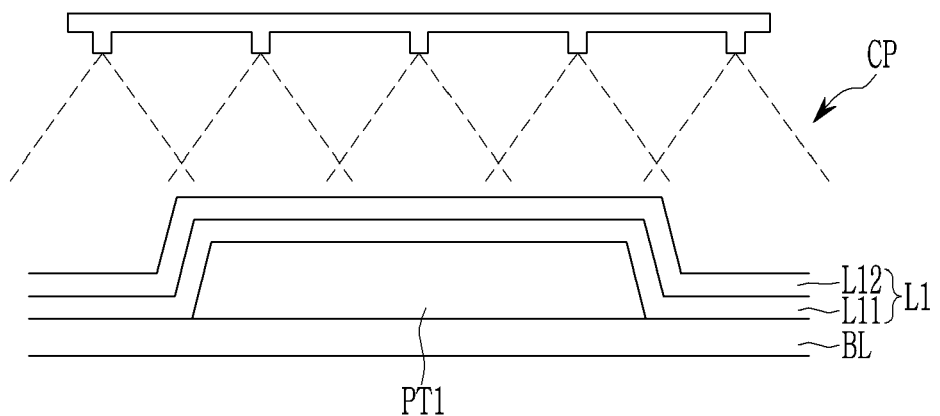

Referring to FIG. 7, after forming the lower layer L1 of the insulating layer IL, a cleaning process CP may be performed. The cleaning may remove particles or foreign substances generated during a manufacturing process of the display panel 10, thereby improving quality and yield of the display panel 10.

Figure 8:
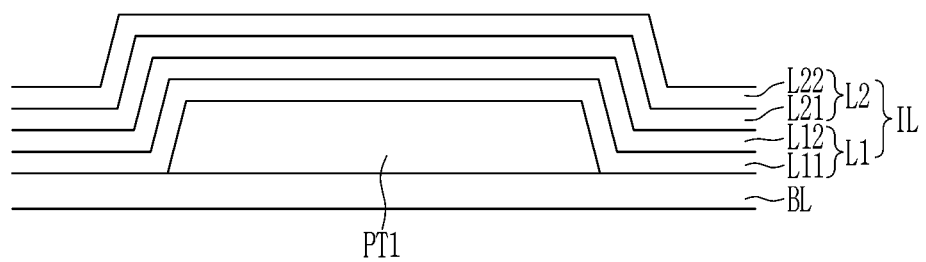

Referring to FIG. 8, a first layer L21 and a second layer L22 of the upper layer L2 may be disposed on the lower layer L1 by a second deposition process. The first layer L21 and the second layer L22 constituting the upper layer L2 of the insulating layer IL may be formed by continuous deposition in one process chamber by using different film formation conditions. The first layer L21 and the second layer L22 may include different materials. The first layer L21 and the second layer L22 may contain a same material or similar material, but may have different film qualities such as a composition ratio, a hydrogen content, and density. The first layer L21 of the upper layer L2 may be formed under a same condition as that of the first layer L11 of the lower layer L1. The second layer L22 of the upper layer L2 may be formed under a same condition as that of the second layer L12 of the lower layer L1, or may be formed under different conditions.

Figure 9:
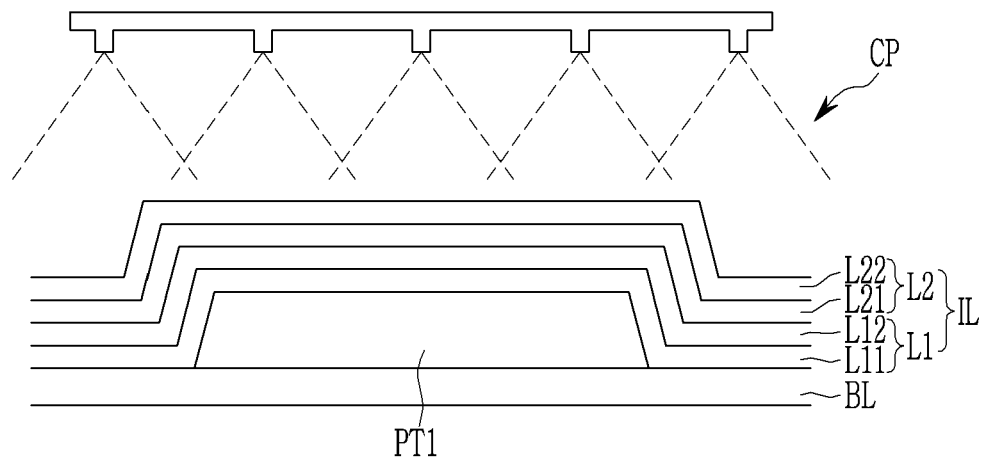

Referring to FIG. 9, after forming the upper layer L2 of the insulating layer IL, the cleaning process CP may be performed. As described above, even in a case that the insulating layer IL may include the lower layer L1 and the upper layer L2 sequentially stacked, the lower layer L1 and the upper layer L2 may be formed by a separate deposition process, and the cleaning process CP may be performed after the lower layer L1 is formed and before the upper layer L2 is formed.

Figure 10:
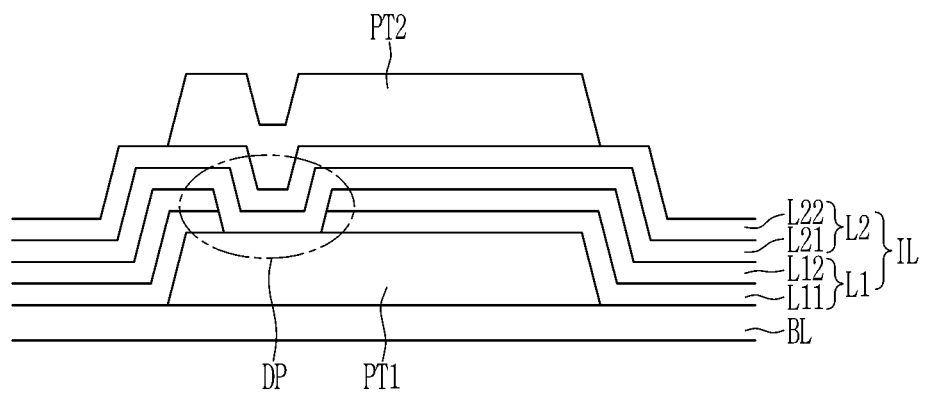
FIG. 10 illustrates a schematic cross-sectional view showing two patterns and an insulating layer disposed therebetween in a display panel according to an example.

FIG. 10 illustrates a schematic cross-sectional view showing two patterns and an insulating layer disposed therebetween in a display panel according to an example.

The display panel illustrated in FIG. 10 may have the same stacked structure as illustrated in FIG. 5, but FIG. 10 illustrates a case where the lower layer L1 of the insulating layer IL may include a defective portion DP.

Particles or foreign substances that may occur before and after formation of the lower layer L1 may be removed in the cleaning process CP after the formation of the lower layer L1, but the lower layer L1 may be torn off as the foreign substances are removed. The lower layer L1 may not be formed in the position where foreign substances may be present. Accordingly, the lower layer L1 may include the defective portion DP that does not cover or overlap the first pattern PT1. However, since the upper layer L2 covers or overlaps the defective portion DP of the lower layer L1, a short circuit does not occur between the first pattern PT1 and the second pattern PT2. In the defective portion DP of the lower layer L1, the upper layer L2 may contact the first pattern PT1. Since the upper layer L2 may be formed under a same condition as that of the lower layer L1, an interface state between the upper layer L2 and the first pattern PT1 may be substantially the same as an interface state between the lower layer L1 and the first pattern PT1.

An insulating layer such as a buffer layer, a gate insulating layer, an interlayer insulating layer, or a passivation layer may be formed by using a material capable of preventing degeneration of a conductive layer, a semiconductor layer, or the like, disposed under or below the layer and securing predetermined device characteristics. In a case that the insulating layer is a multilayer, the layer in contact with the conductive layer, the semi-conductive layer, or the like, may be formed by using a material capable of preventing degeneration of the conductive layer, semiconductor, or the like, and securing predetermined device characteristics. For example, the gate insulating layer may include a silicon oxide, but a lowermost layer in contact with the semiconductor layer may have a small hydrogen content in order to prevent deterioration of a characteristic of the semiconductor layer. In the passivation layer, the lowermost layer in contact with the data conductive layer may include a silicon nitride in order to prevent corrosion (oxidation) of the data conductive layer.

In the insulating layer IL according to an embodiment, since the first layer L21 of the upper layer L2 may be formed under a same condition as that of the first layer L11 of the lower layer L1, an effect of the first layer L21 in contact with the first pattern PT1 in the defective portion DP of the lower layer L1 on the first pattern PT1 may be the same as an effect of the first layer L11 contacting the first pattern PT1 at a top portion of the lower layer L1 on the first pattern PT1. Accordingly, even in a case that the first layer L21 in the defective portion DP contacts the first pattern PT1, the defective portion DP may be compensated without deteriorating the characteristic of the first pattern PT1. As a result, even in a case that the defective portion DP occurs in the insulating layer IL, it is possible to prevent the occurrence of a characteristic deviation between the top portion and the defective portion DP and to ameliorate yield by applying a same insulating layer stack structure as that of the top portion to the defective portion DP.

Figure 11:
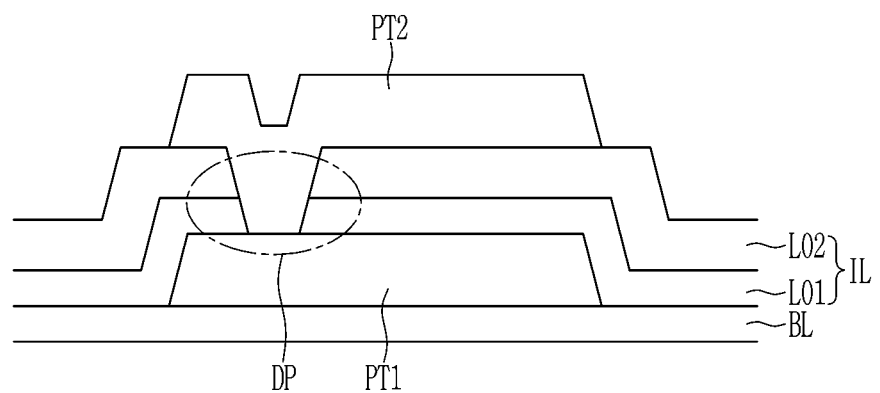
FIG. 11 and FIG. 12 illustrate schematic cross-sectional views showing two patterns and an insulating layer disposed therebetween in a display panel according to a comparative example.
Figure 12:
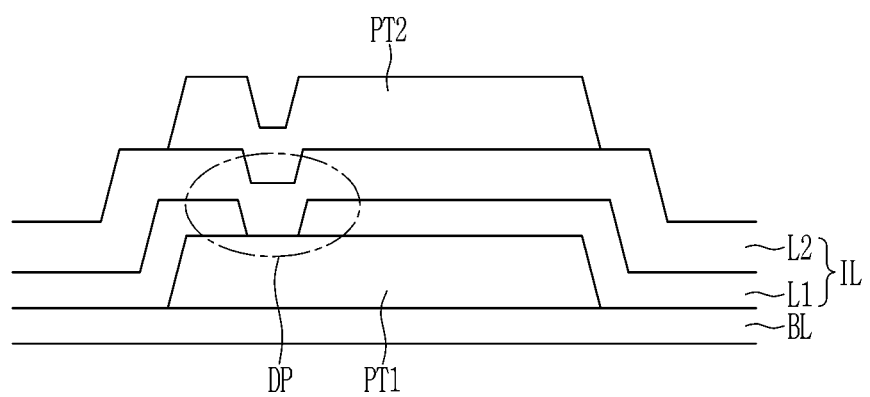

FIG. 11 and FIG. 12 illustrate schematic cross-sectional views showing two patterns and an insulating layer disposed therebetween in a display panel according to a comparative example.

Referring to FIG. 11, the insulating layer IL may be a multilayer including a first layer L01 and a second layer L02 formed through a single deposition process. In a case that the defective portion DP occurs in the insulating layer IL due to foreign substances, the first pattern PT1 and the second pattern PT2 positioned or disposed below and above the insulating layer IL may be connected through the defective portion DP, thereby generating a short circuit.

Referring to FIG. 12, the insulating layer IL may include a lower layer L1 and an upper layer L2 formed through separate deposition processes. The upper layer L2 may be formed under a condition that is different from that of the lower layer L1. For example, the lower layer L1 may include a silicon nitride, and the upper layer L2 may include a silicon oxide. Since the upper layer L2 may cover or overlap the defective portion DP that may occur in the lower layer L1, a short circuit between the first pattern PT1 and the second pattern PT2 may be prevented. However, an effect of the upper layer L2 in contact with the first pattern PT1 in the defective portion DP on the first pattern PT1 may be different from an effect of the lower layer L1 in contact with the first pattern PT1 at the top portion on the first pattern PT1. Accordingly, the upper layer L2 may physically cover or overlap the defective portion DP, but it may cause a change in physical properties of the first pattern PT1, and may affect the device characteristic.

Figure 13:
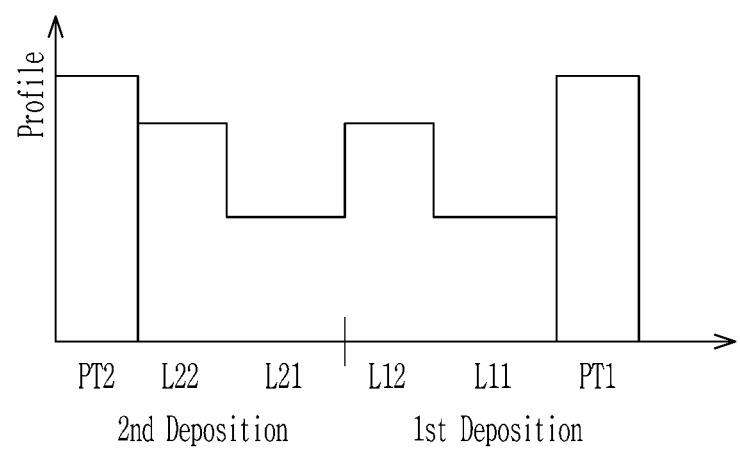
FIG. 13 and FIG. 14 respectively illustrate graphs showing component profiles for each layer in the display panel shown in FIG. 10.
Figure 14:
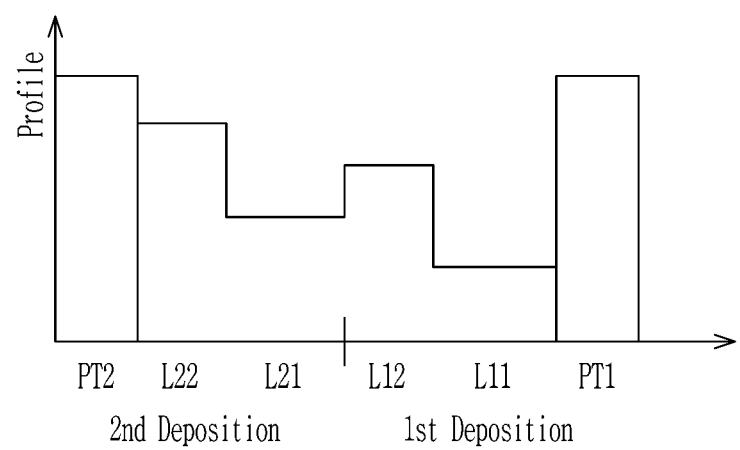

FIG. 13 and FIG. 14 respectively illustrate graphs showing component profiles for each layer in the display panel shown in FIG. 10.

Referring to FIG. 13 and FIG. 14, each layer of the insulating layer IL disposed between the first pattern PT1 and the second pattern PT2 may be checked through component profile analysis. For example, as illustrated in FIG. 13, for a specific or selected component, the first layer L11 that may be a lowermost layer of the lower layer L1 and the first layer L21 that may be a lowermost layer of the upper layer L2 may have a same profile. The second layer L12 that may be an uppermost layer of the lower layer L1 and the second layer L22 that may be an uppermost layer of the upper layer L2 may have a same profile. As illustrated in FIG. 14, even in a case that the component profiles of the lower layer L1 and the upper layer L2 are not completely identical, they may have a tendency to repeat.

Figure 15:
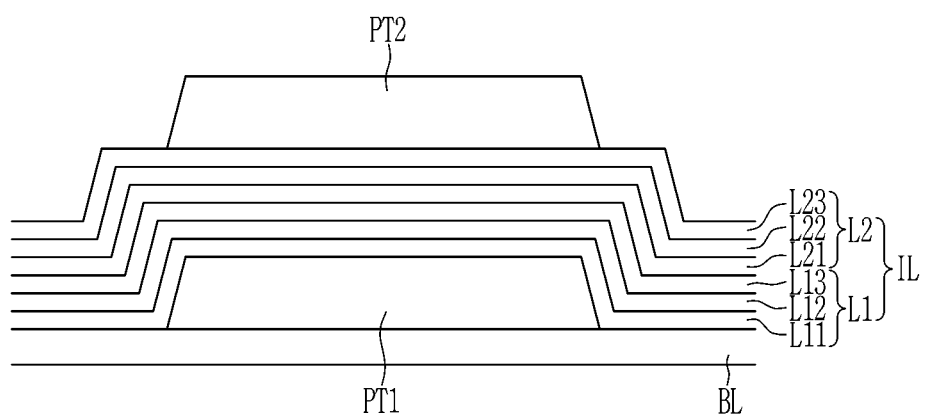
FIG. 15 illustrates a schematic cross-sectional view showing two patterns and an insulating layer disposed therebetween in a display panel according to an embodiment.
Figure 16:
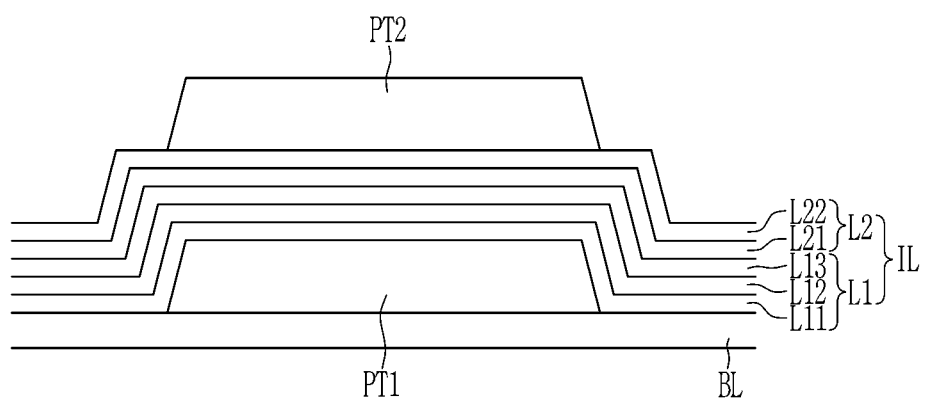
FIG. 16 illustrates a schematic cross-sectional view showing two patterns and an insulating layer disposed therebetween in a display panel according to an example.
Figure 17:
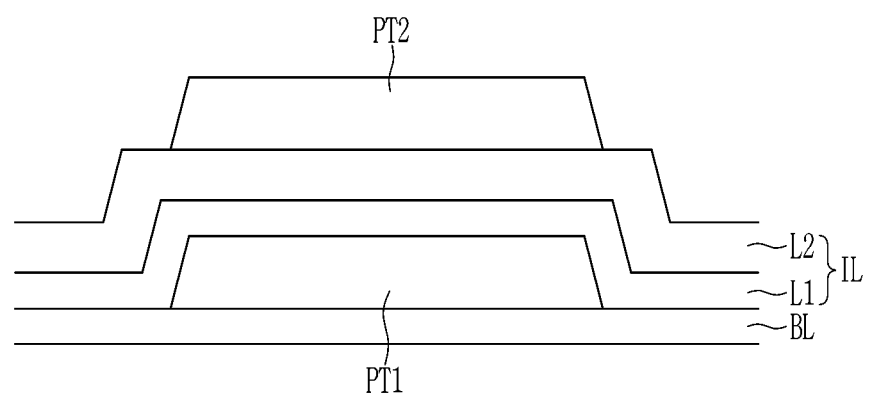
FIG. 17 illustrates a schematic cross-sectional view showing two patterns and an insulating layer disposed therebetween in a display panel according to an example.

FIG. 15, FIG. 16, and FIG. 17 each illustrates a schematic cross-sectional view showing two patterns and an insulating layer disposed therebetween in a display panel according to an example.

Referring to FIG. 15, the insulating layer IL may include a lower layer L1 and an upper layer L2 formed through separate deposition processes. The lower layer L1 may include a first layer L11, a second layer L12, and a third layer L13 which may be sequentially stacked. The second layer L12 may be a layer having a different film quality from those of the first layer L11 and the third layer L13. The upper layer L2 may include a first layer L21, a second layer L22, and a third layer L23 which may be sequentially stacked. The first layer L11 of the lower layer L1 and the first layer L21 of the upper layer L2 may be layers formed under a same process condition, and may be formed by using a same material or similar material. The second layer L12 of the lower layer L1 and the second layer L22 of the upper layer L2 may be layers formed under a same process condition, and may be formed by using a same material or similar material. The third layer L13 of the lower layer L1 and the third layer L23 of the upper layer L2 may be layers formed under a same process condition, and may be formed by using a same material or similar material. As described above, the lower layer L1 and the upper layer L2 of the insulating layer IL may each include three or more layers, and the upper layer L2 may have a structure in which the lower layer L1 may be repeated.

Referring to FIG. 16, the insulating layer IL may include a lower layer L1 and an upper layer L2 formed through separate deposition processes. The lower layer L1 may include a first layer L11, a second layer L12, and a third layer L13 sequentially stacked, and the upper layer L2 may include a first layer L21 and a second layer L22 sequentially stacked. The first layer L11 of the lower layer L1 and the first layer L21 of the upper layer L2 may be layers formed under a same process condition, and may be formed by using a same material or similar material. The third layer L13 of the lower layer L1 and the second layer L22 of the upper layer L2 may be layers formed under a same process condition, and may be formed by using a same material or similar material. As such, the lower layer L1 and the upper layer L2 of the insulating layer IL may include different numbers of layers. However, at least the first layers L11 and L21, which may be lowermost layers of the lower layer L1 and the upper layer L2, may be formed under a same condition, and may have the same film quality. Accordingly, even if a defective portion occurs in the lower layer L1 and the upper layer L2 contacts the first pattern PT1, a characteristic deviation between the top portion and the defective portion may be prevented.

Referring to FIG. 17, the insulating layer IL may include a lower layer L1 and an upper layer L2 formed through separate deposition processes. Each of the lower layer L1 and the upper layer L2 may be formed as one layer or a layer. The lower layer L1 and the upper layer L2 may be layers formed under a same process condition, and may be formed by using a same material or similar material. As in the above-described embodiment, the upper layer L2 may cover or overlap defective portions that may occur in the lower layer L1 without adversely affecting the characteristic of the first pattern PT1.

While the disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
a base layer;
a first pattern disposed on the base layer;
an insulating layer disposed on the first pattern and including a plurality of layers including a first layer, a second layer directly on the first layer, a third layer directly on the second layer, and a fourth layer directly on the third layer; and
a second pattern disposed on the insulating layer, wherein
the first layer and the third layer include a same material,
the second layer and the fourth layer include a same material,
the first pattern includes a portion that contacts the third layer, and
the first layer and the second layer do not overlap the portion of the first pattern.

2. The display device of claim 1, wherein the first layer, the second layer, the third layer, and the fourth layer each include a same material.

3. The display device of claim 1, wherein
the first layer and the second layer include different materials.

4. The display device of claim 3, wherein the first layer and the second layer different hydrogen contents or different densities.

5. The display device of claim 1, wherein
the first layer and the second layer are part of a lower layer of the insulating layer;
the third layer and the fourth layer are part of an upper layer of the insulating layer;
the lower layer and the upper layer of the insulating layer include different numbers of layers.

6. The display device of claim 1, further comprising:
a substrate;
a light blocking layer disposed on the substrate;
a buffer layer disposed on the light blocking layer;
a semiconductor layer of a transistor disposed on the buffer layer;
a gate insulating layer disposed on the semiconductor layer of the transistor;
a gate electrode of the transistor disposed on the semiconductor layer of the transistor;
an interlayer insulating layer disposed on the gate electrode;
an electrode of the transistor disposed on the interlayer insulating layer; and
a passivation layer disposed on the electrode of the transistor,
wherein the insulating layer is one of the buffer layer, the gate insulating layer, the interlayer insulating layer, and the passivation layer.

7. The display device of claim 6, wherein the first pattern is one of the light blocking layer, the semiconductor layer of the transistor, the gate electrode, and the electrode of the transistor.

8. The display device of claim 7, further comprising:
a connection electrode disposed on the passivation layer,
wherein the second pattern is one of the semiconductor layer of the transistor, the gate electrode, the electrode of the transistor, and the connection electrode.

9. A display device comprising:
a substrate;
a buffer layer disposed on the substrate;
a semiconductor layer of a transistor disposed on the buffer layer;
a gate insulating layer disposed on the semiconductor layer of the transistor;
a gate electrode of the transistor disposed on the semiconductor layer of the transistor;
an interlayer insulating layer disposed on the gate electrode;
an electrode of the transistor disposed on the interlayer insulating layer; and
a passivation layer disposed on the electrode of the transistor,
wherein
at least one of the buffer layer, the gate insulating layer, the interlayer insulating layer, and the passivation layer includes a plurality of layers including a first layer, a second layer directly on the first layer, a third layer directly on the second layer, and a fourth layer directly on the third layer,
the first layer and the third layer include a same material,
the second layer and the fourth layer include a same material,
a pattern disposed below the first layer includes a portion that contacts the third layer, and
the first layer and the second layer do not overlap the portion of the pattern.

10. The display device of claim 9, wherein
the first layer, the second layer, the third layer, and the fourth layer are stacked sequentially.

11. The display device of claim 10, wherein the first layer and the second layer include different materials or include a different composition ratio, hydrogen content, and density.

12. The display device of claim 9, wherein
the first layer, the second layer, the third layer, and the fourth layer are stacked sequentially, and
the first layer and the fourth layer include a same material.

13. The display device of claim 12, wherein
the plurality of layers further include a fifth layer stacked on the fourth layer, and
the third layer and the fifth layer include a same material.

14. The display device of claim 12, wherein
the plurality of layers further include a fifth layer and a sixth layer stacked sequentially on the fourth layer, and
the third layer and the fifth layer include a same material.

15. The display device of claim 1, wherein the first layer has one or more film qualities different from the second layer, the different film qualities including at least one of different hydrogen ratios, different hydrogen contents, and different densities.

16. The display device of claim 15, wherein the third layer has one or more film qualities different from the fourth layer, the different film qualities including at least one of different hydrogen ratios, different hydrogen contents, and different densities.

* * * * *